United States Patent
Fork et al.

(10) Patent No.: US 7,638,708 B2
(45) Date of Patent: Dec. 29, 2009

(54) LAMINATED SOLAR CONCENTRATING PHOTOVOLTAIC DEVICE

(75) Inventors: David K. Fork, Los Altos, CA (US); Stephen J. Horne, El Granada, CA (US)

(73) Assignee: Palo Alto Research Center Incorporated, Palo Alto, CA (US)

( * ) Notice: Subject to any disclaimer, the term of this patent is extended or adjusted under 35 U.S.C. 154(b) by 278 days.

(21) Appl. No.: 11/382,008

(22) Filed: May 5, 2006

(65) Prior Publication Data
US 2007/0256726 A1 Nov. 8, 2007

(51) Int. Cl.
*H01L 31/042* (2006.01)
*H01L 31/00* (2006.01)
*G02B 5/09* (2006.01)

(52) U.S. Cl. ......................... 136/246; 136/259; 359/853
(58) Field of Classification Search .................. 136/246, 136/259; 359/853
See application file for complete search history.

(56) References Cited

U.S. PATENT DOCUMENTS

| | | | |
|---|---|---|---|
| 2,789,731 A | 4/1957 | Marraffino | |
| 3,032,008 A | 5/1962 | Land et al. | |
| 3,159,313 A | 12/1964 | Guilford | |
| 3,602,193 A | 8/1971 | Adams et al. | |
| 3,973,994 A | 8/1976 | Redfield | |
| 3,988,166 A | 10/1976 | Beam | |
| 4,018,367 A | 4/1977 | Morine et al. | |
| 4,021,267 A | 5/1977 | Dettling | |
| 4,045,246 A | 8/1977 | Mlavsky et al. | |
| 4,053,327 A * | 10/1977 | Meulenberg, Jr. | ........... 136/256 |
| 4,084,985 A | 4/1978 | Evans, Jr. | |
| 4,086,485 A | 4/1978 | Kaplow et al. | |

(Continued)

FOREIGN PATENT DOCUMENTS

CN 2606309 Y 3/2004

(Continued)

OTHER PUBLICATIONS

Benitez et al. "High-Concentration Mirror-Based Kohler Integrating System for Tandem Solar Cells", WCPEC2006, 4 pages.

(Continued)

*Primary Examiner*—Nam X Nguyen
*Assistant Examiner*—Thanh-Truc Trinh
(74) *Attorney, Agent, or Firm*—Bever, Hoffman & Harms, LLP; Patrick T. Bever

(57) ABSTRACT

A solar concentrator photovoltaic (CPV) device in which concentrator elements (optics, PV cells and wiring) are laminated to form a composite, substantially planar structure. The concentrator optics are implemented by a solid (e.g. glass) optical element that defines a focal point at which solar light received by the optical element is concentrated. Using vacuum lamination techniques, a printed circuit structure attached by way of an adhesive layer onto a surface of the optical element. The printed circuit structure includes one or more non-conductive layers and conductors that are disposed on the non-conductive layers. The PV cell is connected to printed circuit structure, and is positioned at the focal point of the optical element. Optional front and/or back protective layers are also attached prior to the lamination process. A CPV array includes multiple devices formed on an optical tile using a string-like flexible printed circuit structure.

18 Claims, 8 Drawing Sheets

U.S. PATENT DOCUMENTS

| | | | |
|---|---|---|---|
| 4,095,997 A | 6/1978 | Griffiths | |
| 4,119,058 A | 10/1978 | Schmermund | |
| 4,131,485 A | 12/1978 | Meinel et al. | |
| 4,141,231 A | 2/1979 | Kudlich | |
| 4,148,301 A | 4/1979 | Cluff | |
| 4,153,476 A | 5/1979 | Shelpuk | |
| 4,177,083 A | 12/1979 | Kennedy | |
| 4,221,468 A | 9/1980 | Macken | |
| 4,224,081 A | 9/1980 | Kawamura et al. | |
| 4,254,894 A | 3/1981 | Fetters | |
| 4,331,703 A | 5/1982 | Lindmayer | |
| 4,337,758 A | 7/1982 | Meinel et al. | |
| 4,355,196 A | 10/1982 | Chai | |
| 4,461,403 A | 7/1984 | Prahs | |
| 4,476,165 A | 10/1984 | McIntyre | |
| 4,490,418 A | 12/1984 | Yoshida | |
| 4,521,457 A | 6/1985 | Russell et al. | |
| 4,540,843 A | 9/1985 | Gochermann et al. | |
| 4,602,120 A | 7/1986 | Wakefield et al. | |
| 4,683,348 A | 7/1987 | Pidgeon et al. | |
| 4,746,370 A | 5/1988 | Woolf | |
| 4,747,517 A | 5/1988 | Hart | |
| 4,792,685 A | 12/1988 | Yamakawa | |
| 4,796,038 A | 1/1989 | Allen et al. | |
| 4,841,946 A | 6/1989 | Marks | |
| 4,847,349 A * | 7/1989 | Ohta et al. | 528/125 |
| 4,849,028 A | 7/1989 | Krause | |
| 4,855,884 A | 8/1989 | Richardson | |
| 4,938,994 A | 7/1990 | Choinski | |
| 4,947,825 A | 8/1990 | Moriarty | |
| 4,952,026 A | 8/1990 | Bellman et al. | |
| 5,000,988 A | 3/1991 | Inoue et al. | |
| 5,004,319 A | 4/1991 | Smither | |
| 5,011,565 A | 4/1991 | Dube et al. | |
| 5,062,899 A | 11/1991 | Kruer | |
| 5,075,281 A | 12/1991 | Testardi | |
| 5,089,055 A | 2/1992 | Nakamura | |
| 5,151,377 A | 9/1992 | Hanoka et al. | |
| 5,167,724 A | 12/1992 | Chiang | |
| 5,180,441 A | 1/1993 | Cornwall et al. | |
| 5,213,628 A | 5/1993 | Noguchi et al. | |
| 5,216,543 A * | 6/1993 | Calhoun | 359/619 |
| 5,254,388 A | 10/1993 | Melby et al. | |
| 5,344,496 A | 9/1994 | Stern et al. | |
| 5,356,488 A | 10/1994 | Hezel | |
| 5,389,159 A * | 2/1995 | Kataoka et al. | 136/251 |
| 5,501,743 A | 3/1996 | Cherney | |
| 5,529,054 A | 6/1996 | Shoen | |
| 5,536,313 A | 7/1996 | Watanabe et al. | |
| 5,538,563 A | 7/1996 | Finkl | |
| 5,543,333 A | 8/1996 | Holdermann | |
| 5,552,820 A | 9/1996 | Genovese | |
| 5,559,677 A | 9/1996 | Errichiello | |
| 5,560,518 A | 10/1996 | Catterall et al. | |
| 5,569,399 A | 10/1996 | Penney et al. | |
| 5,590,818 A | 1/1997 | Raba et al. | |
| 5,665,175 A | 9/1997 | Safir | |
| 5,700,325 A | 12/1997 | Watanabe | |
| 5,873,495 A | 2/1999 | Saint-Germain | |
| 5,918,771 A | 7/1999 | van der Heijden | |
| 5,929,530 A | 7/1999 | Stone | |
| 5,949,123 A | 9/1999 | Le et al. | |
| 5,981,902 A | 11/1999 | Arita et al. | |
| 5,990,413 A | 11/1999 | Ortabasi | |
| 6,011,307 A | 1/2000 | Jiang et al. | |
| 6,020,554 A | 2/2000 | Kaminar et al. | |
| 6,032,997 A | 3/2000 | Elliott et al. | |
| 6,047,862 A | 4/2000 | Davies | |
| 6,130,465 A * | 10/2000 | Cole | 257/431 |
| 6,140,570 A | 10/2000 | Kariya | |
| 6,164,633 A | 12/2000 | Mulligan et al. | |
| 6,203,621 B1 | 3/2001 | Tran et al. | |
| 6,232,217 B1 | 5/2001 | Ang et al. | |
| 6,257,450 B1 | 7/2001 | Jackson et al. | |
| 6,274,508 B1 | 8/2001 | Jacobsen et al. | |
| 6,278,054 B1 | 8/2001 | Ho et al. | |
| 6,293,498 B1 | 9/2001 | Stanko et al. | |
| 6,310,281 B1 | 10/2001 | Wendt et al. | |
| 6,351,098 B1 | 2/2002 | Kaneko | |
| 6,354,791 B1 | 3/2002 | Wytman et al. | |
| 6,379,521 B1 | 4/2002 | Nishio | |
| 6,398,370 B1 | 6/2002 | Chiu et al. | |
| 6,407,329 B1 * | 6/2002 | Iino et al. | 136/251 |
| 6,418,986 B1 | 7/2002 | Gabriele | |
| 6,420,266 B1 | 7/2002 | Smith et al. | |
| 6,423,140 B1 | 7/2002 | Liu et al. | |
| 6,479,395 B1 | 11/2002 | Smith et al. | |
| 6,527,964 B1 | 3/2003 | Smith et al. | |
| 6,531,653 B1 | 3/2003 | Glenn et al. | |
| 6,555,739 B2 | 4/2003 | Kawam | |
| 6,568,863 B2 | 5/2003 | Murata | |
| 6,590,235 B2 | 7/2003 | Carey et al. | |
| 6,597,510 B2 | 7/2003 | Bunkenburg et al. | |
| 6,623,579 B1 | 9/2003 | Smith et al. | |
| 6,663,944 B2 | 12/2003 | Park et al. | |
| 6,666,165 B2 | 12/2003 | Shiraishi et al. | |
| 6,667,434 B2 | 12/2003 | Morizane et al. | |
| 6,743,478 B1 | 6/2004 | Kiiha et al. | |
| 6,896,381 B2 | 5/2005 | Benitez et al. | |
| 6,924,493 B1 | 8/2005 | Leung | |
| 7,045,794 B1 | 5/2006 | Spallas et al. | |
| 7,101,592 B2 | 9/2006 | Gueggi et al. | |
| 7,152,985 B2 | 12/2006 | Benitez et al. | |
| 7,160,522 B2 | 1/2007 | Minano Dominguez et al. | |
| 7,181,378 B2 | 2/2007 | Benitez et al. | |
| 7,388,147 B2 | 6/2008 | Mulligan et al. | |
| 7,394,016 B2 | 7/2008 | Gronet | |
| 2001/0008230 A1 | 7/2001 | Keicher et al. | |
| 2002/0056473 A1 | 5/2002 | Chandra et al. | |
| 2002/0060208 A1 | 5/2002 | Liu et al. | |
| 2002/0148497 A1 | 10/2002 | Sasaoka et al. | |
| 2002/0149107 A1 | 10/2002 | Chang et al. | |
| 2002/0154396 A1 | 10/2002 | Overbeck | |
| 2003/0015820 A1 | 1/2003 | Yamazaki et al. | |
| 2003/0095175 A1 | 5/2003 | Agorio | |
| 2003/0201581 A1 | 10/2003 | Weber et al. | |
| 2003/0232174 A1 | 12/2003 | Chang et al. | |
| 2004/0012676 A1 | 1/2004 | Weiner | |
| 2004/0031517 A1 | 2/2004 | Bareis | |
| 2004/0048001 A1 | 3/2004 | Kiguchi et al. | |
| 2004/0070855 A1 | 4/2004 | Benitez et al. | |
| 2004/0084077 A1 | 5/2004 | Aylaian | |
| 2004/0151014 A1 | 8/2004 | Speakman | |
| 2004/0191422 A1 | 9/2004 | Kataoka | |
| 2004/0200520 A1 | 10/2004 | Mulligan et al. | |
| 2004/0211460 A1 | 10/2004 | Simburger et al. | |
| 2005/0000566 A1 | 1/2005 | Posthuma et al. | |
| 2005/0029236 A1 | 2/2005 | Gambino et al. | |
| 2005/0034751 A1 | 2/2005 | Gross et al. | |
| 2005/0046977 A1 | 3/2005 | Shifman | |
| 2005/0133084 A1 | 6/2005 | Joge et al. | |
| 2005/0194037 A1 | 9/2005 | Asai | |
| 2005/0221613 A1 | 10/2005 | Ozaki et al. | |
| 2005/0253308 A1 | 11/2005 | Sherwood | |
| 2006/0207650 A1 * | 9/2006 | Winston et al. | 136/259 |
| 2006/0231133 A1 | 10/2006 | Fork et al. | |
| 2006/0251796 A1 | 11/2006 | Fellingham | |
| 2006/0266235 A1 | 11/2006 | Sandhu et al. | |
| 2008/138456 A1 | 6/2008 | Fork et al. | |

FOREIGN PATENT DOCUMENTS

| | | |
|---|---|---|
| CN | 1854637 A | 11/2006 |
| DE | 197 35 281 A1 | 2/1999 |

| | | | |
|---|---|---|---|
| EP | 0 257 157 A | 3/1988 | |
| EP | 1 145 797 A | 10/2001 | |
| EP | 1 763 086 A | 3/2007 | |
| EP | 1 833 099 A | 9/2007 | |
| JP | 60082680 A | 5/1985 | |
| JP | 02 187291 A | 7/1990 | |
| JP | 2002-111035 A | 4/2002 | |
| JP | 2004-266023 A | 9/2004 | |
| JP | 2005051216 | 2/2005 | |
| WO | WO 91/08503 A | 6/1991 | |
| WO | WO 91/15355 | 10/1991 | |
| WO | WO 94/28361 A1 | 12/1994 | |
| WO | WO 97/21253 A | 6/1997 | |
| WO | WO 97/48519 A | 12/1997 | |
| WO | WO 00/49421 A1 | 8/2000 | |
| WO | WO 00/49658 A1 | 8/2000 | |
| WO | WO 00/50215 | 8/2000 | |
| WO | WO 02/052250 A | 7/2002 | |
| WO | WO 02/097724 A1 | 12/2002 | |
| WO | WO 2005/070224 A1 | 8/2005 | |
| WO | WO 2005/107957 A1 | 11/2005 | |
| WO | WO 2005/107958 A1 | 11/2005 | |
| WO | WO 2006/097303 A1 | 9/2006 | |

OTHER PUBLICATIONS

J. Sun et al. "Modeling and Experimental Evaluation of Passive Heat Sinks for Miniature High-Flux Photovoltaic Concentrators", Transactions of the ASME, vol. 127, pp. 138-145 (2005).

Terao et al. "A Mirror-Less Design for Micro-Concentrator Modules", Conference Record of the 28$^{th}$ IEEE Photovoltaic Specialists Conference (2000) pp. 1416-1419.

U.S. Appl. No. 11/282,882, filed Nov. 17, 2005, Fork et al.

U.S. Appl. No. 11/282,829, filed Nov. 17, 2005, Fork et al.

U.S. Appl. No. 11/336,714, filed Jan. 20, 2006, Fork et al.

Cousins et al. "Manufacturing and Design Issues for Thin Silicon Solar Cells Manufactured on FZ(B), MCZ(B), CZ(Ga) and CZ(B) Wafers", IEEE, pp. 987-990, 2005.

Cuevas et al. "50 Per Cent More Output Power from an Albedo-Collecting Flat Panel Using Bifacial Solar Cells", *Solar Energy*, vol. 29, No. 5, pp. 419-420, 1982.

Finlayson et al. "$Bi_2O_3$-$WO_3$ compounds for photocatalytic applications by solid state and viscous processing", Title from a conference scheduled for Oct. 6-7, 2004 in Munich, 8 pages.

Kenis et al. "Fabrication inside Microchannels Using Fluid Flow", Accounts of Chemical Research, vol. 33, No. 12, 2000, pp. 841-847.

Kerschaver et al. "Back-contact Solar Cells: A Review," Progress in Photovoltaics: Research and Applications, 2006, vol. 14, pp. 107-123.

Kränzl et al. "Bifacial Solar Cells on Multi-Crystalline Silicon", 15$^{th}$ International Photovoltaic Science & Engineering Conference, Shanghai, China, 2 pages, 2005.

Mueller et al. "Breathable Polymer Films Produced by the Microlayer Coextrusion Process", Journal of Applied Polymer Science, vol. 78, pp. 816-828, 2000.

Neuhaus et al. "Industrial Silicon Wafer Solar Cells," Advances in OptoElectronics, vol. 2007, 2007, 15 pages.

Rao et al. "Microfabricated Deposition Nozzles for Direct-Write Assembly of Three-Dimensional Periodic Structures", *Advanced Materials*, vol. 17, No. 3, Feb. 10, 2005, 5 pages.

Recart et al. "Large Area Thin BSF Solar Cells With Simultaneously Diffused Boron and Phosphorus Screen Printed Emitters", IEEE, pp. 1213-1216, 2005.

Sundararajan et al. "Three-Dimensional Hydrodynamic Focusing in Polydimethylsiloxane (PDMS) Microchannels", Journal of Microelectromechanical Systems, vol. 13, No. 4, Aug. 2004, pp. 559-567.

Taguchi et al. An Approach for the Higher Efficiency in the HIT Cells, IEEE, pp. 866-871, 2005.

Van Hoy et al. "Microfabrication of Ceramics by Co-extrusion", *J. Am. Ceram. Soc.*, vol. 81, No. 1, pp. 152-158, 1998.

Weber et al. "Modelling of Sliver® Modules Incorporating a Lambertian Rear Reflector", The Australian National University, Canberra Act 0200, Australia, 4 pages, 2005.

Gimac Compact Triplex TR12 Micro-Coextrusion Plant, NPE 2000, Jun. 19-23, 2000, McCormick Place, Chicago, IL, Booth 13154, http://www.citsco.com/NPE2000/npepage1.html, 2 pages.

Extrusion/Coextrusion Dies, Extrusion Dies Industries, LLC, http://www.extrusiondies.com/PRODUCTS/ExtrusionDies/multimanifoldDies.html, 1 page.

Hitachi: Offering Total Environmental Solutions, Environmental Activities, http://greenweb.hitachi.co.jp/en/sustainable/total-solution.html, 5 pages, 2003.

Sanyo Solar Panels, Sanyo HIT Solar Panel Discount—Solar Electric Supply, Sanyo Solar Modules, http://www.solarelectricsupply.com/Solar_Panels/Sanyo/sanyo.html, 4 pages, 2005.

SunPower Corp. News Release, May 12, 2008, Available URL: http://investors.sunpowercorp.com/releasedetail.cfm?ReleaseID=309613.

Schweizer, Peter M. "Curtain Coating Technology Can Mean Big Benefits," Paper, Film & Foil Converter website, Mar. 1, 2000, 5 pages, http://pffc-online.com/mag/paper_curtain_coating_technology/.

Nijs et al. "Overview of solar cell technologies and results on high efficiency multicrystalline silicon substrates," Solar Energy Materials and Solar Cells, vol. 48, No. 1-4, Nov. 1, 1997, pp. 199-217.

Sparber et al. "Comparison of texturing methods for monocrystalline silicon solar cells using KOH and $Na_2CO_3$," 3$^{rd}$ World Conf. Photovoltaic Energy Conversion, Osaka, 2003, pp. 1372-1375.

MacDonald et al. "Texturing industrial multicrystalline silicon solar cells," Solar Energy, vol. 76, 2004, pp. 277-283.

Tool et al. "Straightforward in-line processing for 16.8% efficient mc-Si solar cells," 31$^{st}$ IEEE Photovoltaic Specialists Conf., Florida, 2005, pp. 1324-1327.

Fukui et al. "17.7% efficiency large area multicrystalline silicon solar cell using screen-printed metallization technique," 31$^{st}$ IEEE Photovoltaic Specialists Conf., Florida, 2005, pp. 979-982.

Mitsubishi Electric Corp., Mitsubishi Electric Develops Practical-Use Multi-Crystalline Silicon Solar Cell with World's Highest Conversion Efficiency Rate of 18.6%, News Release #2432, Tokyo, Mar. 19, 2008, Available URL: http://global.mitsubishielectric.com/news/news_releases/2008/mel0705.pdf.

Zhao et al. "19.8% efficient 'honeycomb' textured multicrystalline and 24.4% monocrystalline silicon solar cells," Applied Physics Letters, vol. 73, pp. 1991-1993, 1998.

Abbott et al. "Optical and Electrical Properties of Laser Texturing for High-efficiency Solar Cells," Progress in Photovoltaics: Research and Applications, Published online Jan. 5, 2006, vol. 14, pp. 225-235, 2006.

Murphy, Jr. "Home photovoltaic systems for physicists " *Physics Today*, Jul. 2008, pp. 42-47.

Brogren et al. "Optical properties, durability, and system aspects of a new aluminum-polymer-laminated steel reflector for solar concentrators", Jan. 2004, Solar Energy Materials and Solar Cells, 82, pp. 387-412.

Mauk et al. "'Buried' Metal/Dielectric/Semiconductor Reflectors for Light Trapping in Epitaxial Thin-Film Solar Cells", May 1996, IEEE, 25th PVSC, pp. 147-150.

Munzer et al. "Thin Monocrystalline Silicon Solar Cells", Oct. 1999, IEEE Transactions on Electron Devices, vol. 46, No. 10, pp. 2055-2061.

Terao, Akira "MicroDish: A Novel Reflective Optic For Flat-Plate Micro-Concentrator", SPIE's 49$^{th}$ Annual Meeting, Aug. 2-6, 2004, Denver, Colorado, USA, 9 pages.

Gordon et al. "Optical performance at the thermodynamic limit with tailored imagin designs", Dec. 2004, 16 pages.

Mulligan et al. "A Flat-Plate Concentrator: Micro-Concentrator Design Overview", 2000 IEEE, pp. 1495-1497.

Swanson, Richard M. "The Promise of Concentrators", Received Jun. 16, 1999, Revised Oct. 3, 1999, pp. 93-111.

Bett et al. "FLATCON™ and FLASHCON™ Concepts For High Concentration PV", Presented at the 19$^{th}$ European Photovoltaic Solar Energy Conf., Jun. 7-11, 2004, Paris, 4 pages.

Alvarez et al. "RXI Concentrator For 1000X Photovoltaic Energy Conversion".

Mulligan et al. "Development Of Chip-Size Silicon Solar Cells".

Nguyen, Luu "Wafer Level Packaging For Analog/Mixed Signal Applications", MEPTEC Int. Wafer Level Packaging Conference, Aug. 22, 2002.

* cited by examiner

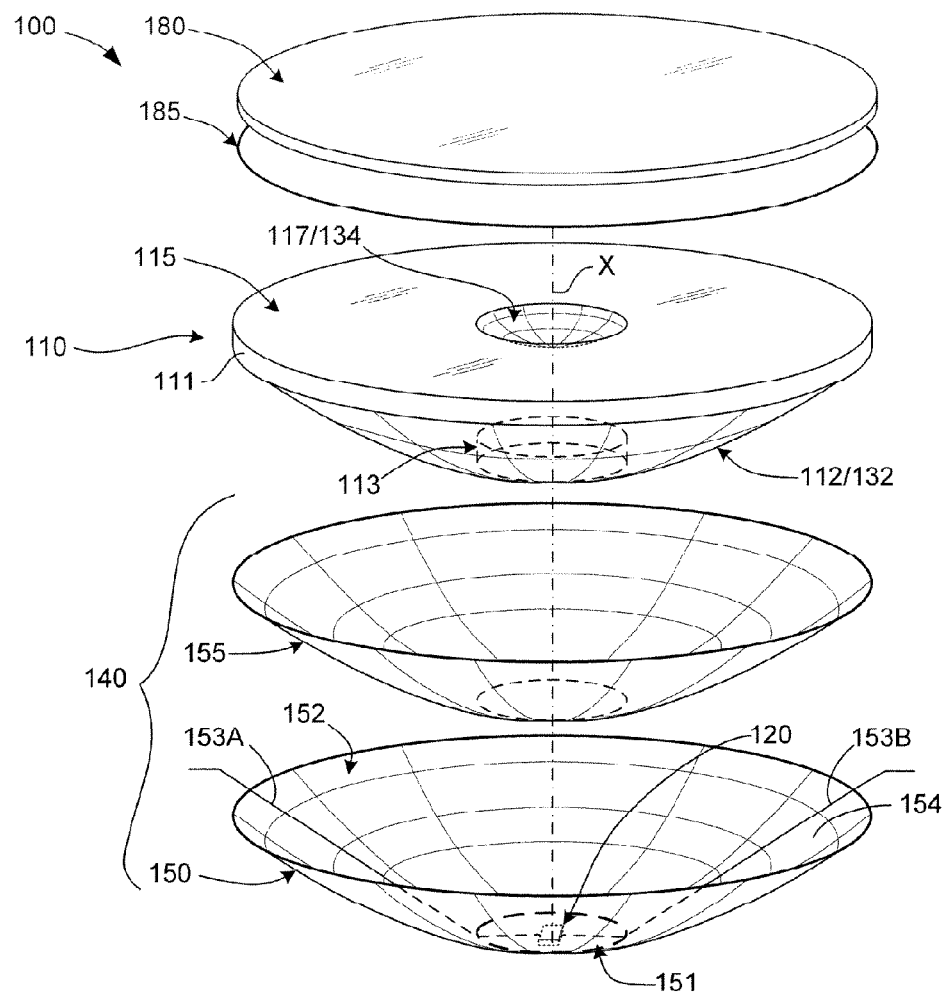
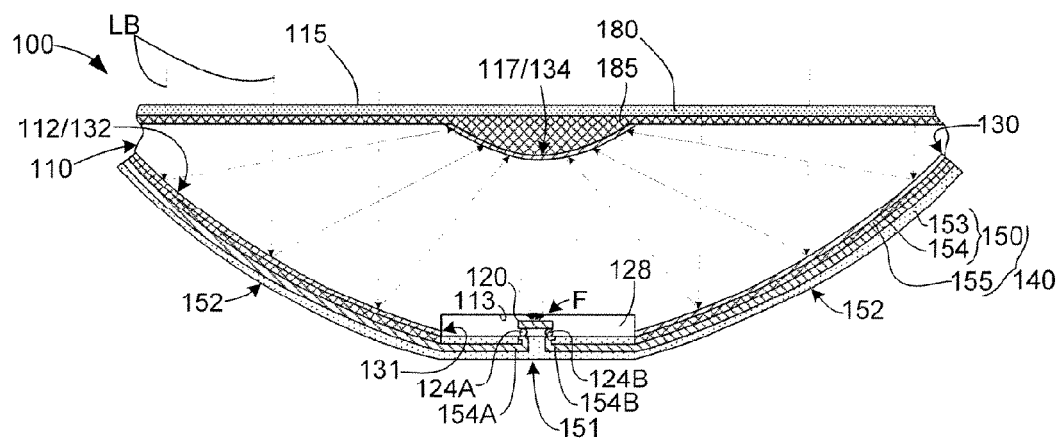

LAMINATED SOLAR CONCENTRATING PHOTOVOLTAIC DEVICE

FIELD OF THE INVENTION

This invention relates to solar power generators, and more particularly to cost-efficient structures and methods for producing solar concentrator photovoltaic (CPV) devices.

BACKGROUND OF THE INVENTION

Photovoltaic solar energy collection devices used to generate electric power generally include flat-panel collectors and concentrating solar collectors. Flat collectors generally include PV cell arrays and associated electronics formed on semiconductor (e.g., monocrystalline silicon or polycrystalline silicon) substrates, and the electrical energy output from flat collectors is a direct function of the area of the array, thereby requiring large, expensive semiconductor substrates. Concentrating solar collectors reduce the need for large semiconductor substrates by concentrating light beams (i.e., sun rays) using, e.g., a parabolic reflectors or lenses that focus the beams, creating a more intense beam of solar energy that is directed onto a small PV cell. Thus, concentrating solar collectors have an advantage over flat-panel collectors in that they utilize substantially smaller amounts of semiconductor. Another advantage that concentrating solar collectors have over flat-panel collectors is that they are more efficient at generating electrical energy.

A problem with conventional concentrating solar collectors is that, unlike flat-panel solar collectors, they are expensive to operate and maintain. Unlike flat-panel collectors that are laminated into a single rigid sheet, the reflectors and/or lenses used in conventional concentrating collectors to focus the light beams are produced separately, and must be painstakingly assembled to provide the proper alignment between the focused beam and the PV cell. Over time, the reflectors and/or lenses can become misaligned due to thermal cycling or vibration, thus requiring expensive maintenance to adjust the reflectors/lenses, which is not ever required with flat-panel collectors. Moreover, when the reflectors and/or lenses of conventional concentrating collectors become dirty due to exposure to the environment, maintenance in the form of cleaning and adjusting the reflectors/lenses can be significant, particularly when the reflectors/lenses are produced with uneven shapes that are difficult to clean. In contrast, flat-panel solar collectors are easy to clean due to their substantially flat surfaces. Thus, although flat-panel collectors may be more expensive to produce due to the relatively large amounts of semiconductor, concentrating solar collectors are substantially more expensive to maintain.

What is needed is a concentrator photovoltaic device that provides both the production-cost benefits of concentrating solar collectors and the maintenance-cost benefits of flat-panel solar collectors.

SUMMARY OF THE INVENTION

The present invention is directed to a solar concentrator photovoltaic (CPV) device in which concentrator elements (optics, PV cells and wiring) are laminated to form a composite, substantially planar structure. The concentrator optics are implemented by a solid (e.g. glass) optical element that defines a focal point at which solar light received by the optical element is concentrated. For the purposes of this invention, the use of the term focal point refers both to concentration by imaging and non-imaging elements. Using vacuum lamination techniques, a printed circuit structure attached by way of an adhesive layer onto a surface of the optical element. The printed circuit structure includes one or more non-conductive layers and conductors that are disposed on the non-conductive layers. The PV cell includes terminals that are electrically connected to the conductors of the printed circuit structure, and is positioned at the focal point of the optical element. Optional front and/or back protective layers are also attached prior to the application of full heat and pressure associated with the vacuum lamination process, which causes the various layers to fuse together. The vacuum lamination process prevents the formation of hollow spaces where moisture can accumulate and cause failures, thus providing a reliable low-cost solar concentrator assembly. The resulting CPV device structure utilizes substantially less semiconductor than flat-panel solar collectors, thus providing a significant production-cost benefit over flat-panel devices. In addition, because the concentrator elements are permanently fixed inside the composite structure, and because the composite structure has substantially flat front and back surfaces, the CPV device structure provides maintenance cost benefits similar to flat-panel solar collectors.

In accordance with an embodiment of the invention, the solid optical element includes a Cassegrain-type optical system in which received light is reflected between primary and secondary mirrors within the optical element. The solid glass or plastic optical structure includes a relatively large convex (protruding) lower surface, a central cavity defined in the lower surface, and an upper aperture surface having a relatively small centrally-located concave (curved) surface (e.g., a depression). The Cassegrain-type primary and secondary mirrors are respectively disposed on the convex lower surface and in the central depression such that the reflective surfaces face into the optical structure. In one embodiment, the convex and concave surfaces are associated conic (e.g., hyperbolic and/or parabolic) surfaces arranged such that the portion of light passing through the aperture surface onto any point on the primary mirror is reflected to a corresponding point on the secondary mirror, which in turn re-reflects the light, and focuses the light into the central cavity and onto the PV cell. A transparent adhesive or resilient material is disposed in the central cavity to avoid hollow regions surrounding the PV cell. Because the optical structure is solid (i.e., because the convex and concave surfaces remain fixed relative to each other), the primary and secondary mirrors remain permanently aligned and do not provide voids or hollow portions that can trap moisture, thus maintaining optimal optical operation while minimizing maintenance costs. Further, the loss of light at gas/solid interfaces is minimized because only solid optical material (e.g., low-iron glass) is positioned between the primary and secondary mirrors. Moreover, similar to flat-panel collectors, the flat aperture surface is easy to clean.

In accordance with another aspect of the present invention, the printed circuit structure includes a central portion disposed over the central cavity of the optical element, and peripheral portions extending from the central portion over the convex surface. The PV cell is mounted onto a central portion of the printed circuit structure prior to lamination onto the Optical element. In one embodiment, the non-conductive layers of the printed circuit structure comprise a flexible polyimide film, and the conductors of the printed circuit structure are copper or Fe—Ni alloy that is disposed on the flexible polyimide film. In one embodiment, one side of the pn junction photocells, say the emitter side of the device, is contacted by a stamped piece of metal that serves both as an electrical conductor and the head spreader. The metal stamping may optionally also include a heat slug portion that is designed to fit into the recess in the primary mirror. The other side of the cell, say the base, is contacted by a piece of flex. In one embodiment the peripheral portions of the printed circuit structure are cut or otherwise separated into a plurality of radial arms that extend from the central support region, which facilitates close contact to curved lower surface of the solid optical element during assembly. In one embodiment, one or more of the conductors are thickened to serve as heat spreaders that facilitate the radiation of heat from the aperture surface.

In accordance with an embodiment of the invention, a transparent coversheet is disposed over the aperture surface and the secondary mirror, and is laminated onto the optical element with a second adhesive layer disposed between the optical element and the coversheet. In optional embodiments, the transparent coversheet includes tempered glass, an anti-reflective coating, or a filter for rejecting radiation having one or more predetermined wavelengths.

In accordance with an aspect of the invention, the thickness of the plastic laminate layers on the backside of the concentrator is not uniform. Specifically, it is desired that the heat conduction path out the back of the CPV device is as short a distance as possible. Ideally, the thickness of the lamination covering the hottest portion of the device (the apex of the primary mirror) is only as thick as necessary to ensure sufficient electrical insulation of the wiring. It is also desired to fill in the interstices of the array of concentrators in order to give the array added mechanical strength. This thickness variation in lamination is a natural outcome of material flow during the lamination process. A preferred way to achieve this is to have an inner layer of lower melting point material such as EVA adhesive (e.g., produced by Dupont), and an outer layer of relatively high melting point plastic material such as Tedlar®, which is a trademark of the DuPont Corporation, or TPT (Tedlar, polyester, Tedlar). The melting and flowing of the EVA during the application of vacuum and bladder pressure in the laminator will ensure that it will be thinnest at the apical points of the concentrator array. The lamination operation therefore serves several purposes simultaneously; it holds the optical, electrical and protective layers together, it strengthens the CPV device module, and it planarizes the CPV device module so that the less stretchable outer Tedlar protective layer can conform to the back surface.

In accordance with another embodiment of the present invention, the flexible printed circuit structure includes a layer of laminate adhesive such as EVA. During lamination EVA behaves like a viscous hot melt glue, so the degree to which it can flow may be too limited for it to reach all of the way around the flex substrate and bond the interface between the flex and the primary mirror. Because the mirror is a conductive material such as silver, it is a further aspect of this invention invention that an insulating layer may be provided between the flex and the mirror to prevent electrical shorting.

In accordance with another aspect of the invention, the printed circuit structure is arranged as a preassembled string of PV cells that is assembled as a single layer into the laminate stack. This preassembled string may for example be on a flexible printed circuit substrate, i.e. "flex." In one embodiment of this invention, portions of the flex conform to follow the contour of the primary mirror during the lamination process. This is desirable for the thermal conduction of heat out the front of the concentrator. To assist this shape conformation, the flex may be pre-shaped or slit. Pressure applied by the air bladder in the vacuum laminator may be used to assist this shape conformation.

It is a further aspect of this invention that the length of the wiring on the printed flex from cell to cell is larger than the straight line distance between the cells in the completed array of concentrators. This added wiring length allows the printed circuit structure to follow a portion of the primary mirror contour, and provides mechanical "slop" so that the Pv cells can be easily aligned with the focal point of each optical system.

In accordance with another embodiment of the invention, multiple arrays of concentrators are laminated together into a common assembly. It is expected that the size of the largest optical concentrator arrays that can be formed in a typical glass or plastic molding apparatus (currently on the order of one square foot) will be considerably smaller than the largest module area that can be accommodated in a laminator (currently several square meters). It is also an aspect of this invention that a frame structure is used to hold multiple optical tiles in a laminated structure. This frame structure may take a form similar to a windshield frame. The tiles may be glued into this frame with an adhesive.

BRIEF DESCRIPTION OF THE DRAWINGS

These and other features, aspects and advantages of the present invention will become better understood with regard to the following description, appended claims, and accompanying drawings, where:

FIG. 1 is an exploded perspective view showing a simplified CPV device according to an embodiment of the present invention;

FIG. 2 is a cross-sectional side view showing the CPV device of FIG. 1 during operation;

DETAILED DESCRIPTION OF THE DRAWINGS

Figure 3:
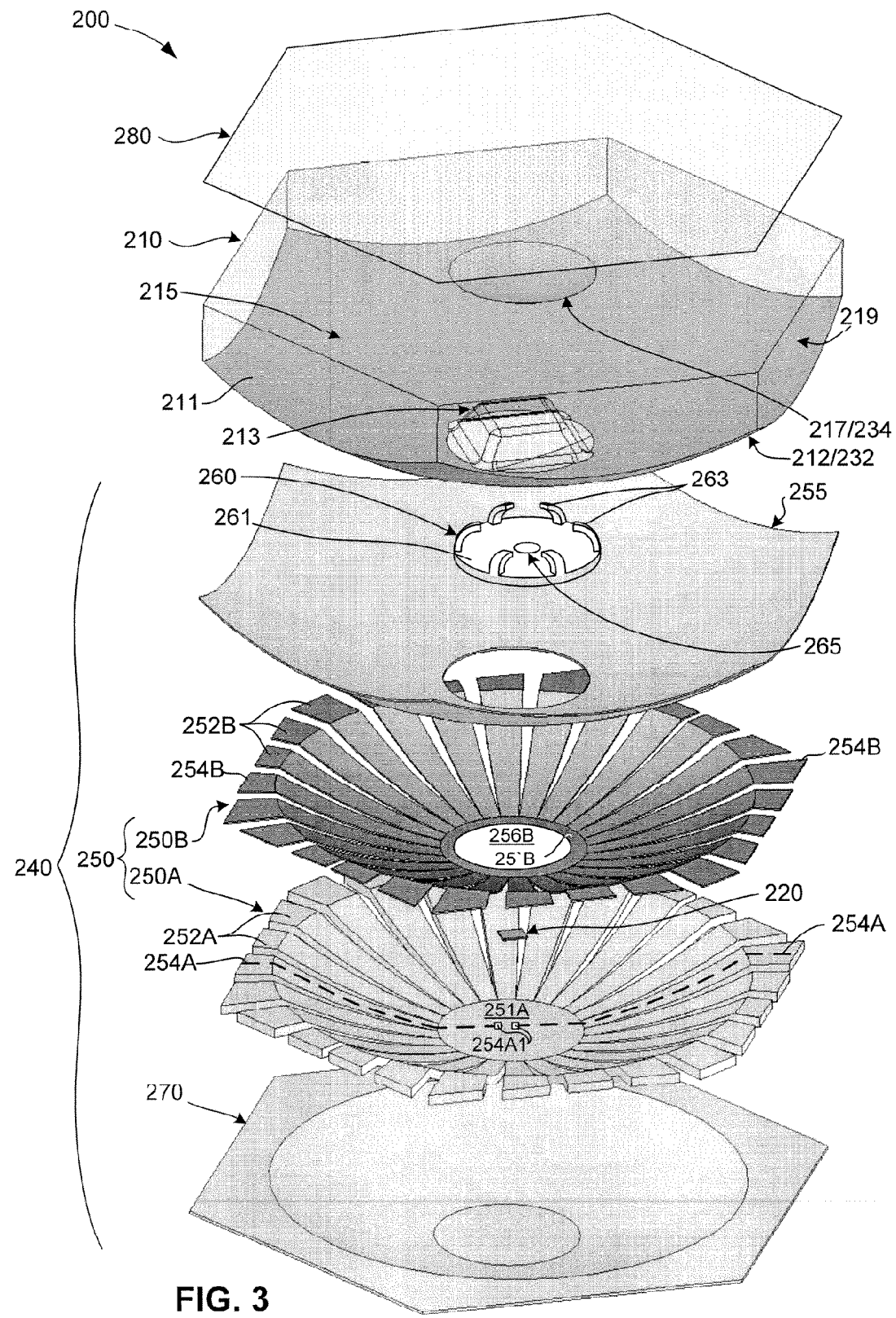
FIG. 3 is an exploded perspective view showing a CPV device according to another embodiment of the present invention.

The present invention relates to cost-efficient structures and methods for producing solar concentrator photovoltaic (CPV) devices using a solid dielectric solar concentrator, such as that disclosed in co-owned and co-pending U.S. patent application Ser. No. 11/110,611 entitled "CONCENTRATING SOLAR COLLECTOR WITH SOLID OPTICAL ELEMENT", which is incorporated herein by reference in its entirety. In particular, the present invention relates to a laminated CPV device in which the optics, wiring, PV cells are packaged in such a way that there are no hollow spaces where moisture can accumulate and cause failures, and in such a way that avoids the maintenance costs of conventional Cassegrain-type PV arrays.

FIG. 1 is an exploded perspective view showing an internal mirror, Cassegrain-type concentrator photovoltaic (CPV) device 100 according to a representative embodiment of the present invention. CPV device 100 generally includes an optical element 110, a photovoltaic (PV) cell 120, a backsheet 140 including a printed circuit structure 150, and a glass top coversheet 180.

Optical element 110 is a solid, disk-like, light-transparent structure including an upper layer 111, a relatively large convex surface 112 protruding from a lower side of upper layer 111, a substantially flat aperture surface 115 disposed on an upper side of upper layer 111, and a relatively small concave (curved) surface (depression) 117 defined in aperture surface 115 (i.e., extending into upper layer 111). In order to minimize material, weight, thickness and optical adsorption, upper layer 111 may be vanishingly small. In one embodiment, optical element 110 is molded using a low-iron glass (e.g., Optiwhite glass produced by Pilkington PLC, UK) structure according to known glass molding methods. Alternatively, clear plastic may be machined and polished to form single-piece optical element 110, or separate pieces by be glued or otherwise secured to form optical element 110. In a preferred embodiment, optical element 110 is 5 to 12 mm thick and 20 to 40 mm wide. This thickness helps to ensure that the heat conduction path from the backside convex surface 112 to aperture surface 115 does not become too resistive as it would be if optical element 110 were either thicker or hollow.

PV cell 120 is located in a central first side (cavity) region 113 that is defined in the center of convex surface 112. A first (e.g., emitter) terminal 124A and a second (e.g., base) terminal 124B (indicated in FIG. 2) of PV cell 120 are connected by way of solder balls to printed circuit structure 150. A gap filling transparent material 128, such as silicone (e.g., polydiphenylsiloxane or polymethylphenylsiloxane), is also disposed inside cavity 113 over PV cell 120, and serves to minimize the disruptive break in the refractive indicies between the outside surface of cavity 113 and PV cell 120. Suitable photovoltaic (concentrator solar) cells are produced, for example, by Spectrolab, Inc. of Sylmar, Calif., USA. Another suitable photovoltaic cell is disclosed in co-owned and co-pending U.S. patent application Ser. No. 11/382,004, entitled "SOLAR CONCENTRATING PHOTOVOLTAIC DEVICE WITH RESILIENT CELL PACKAGE ASSEMBLY", which is co-filed with the present application and incorporated herewith by reference in its entirety.

In an alternative implementation, the optics may be selected to produce a longer focal length. In place of cavity 113, a mesa (not shown) extends below convex surface 112. The photovoltaic cell 120 is placed on the mesa.

Primary mirror 132 and secondary mirror 134 are respectively disposed on convex surface 112 and concave surface 117. Primary mirror 132 and secondary mirror 134 are shaped and arranged such that, as shown in FIG. 2, light beams LB traveling in a predetermined direction (e.g., perpendicular to aperture surface 115) that enters optical element 110 through a specific region of aperture surface 115 is reflected by a corresponding region of primary mirror 132 to an associated region of secondary mirror 134, and from the associated region of secondary mirror 134 to PV cell 120 (e.g., directly from secondary mirror 134 to PV cell 120, or by way of a reflective or refractive surface positioned between secondary mirror and PV cell 120). As used herein, directional terms such as "upper", "lower", "above" and "below" are intended to provide relative positions for purposes of description, and are not intended to designate an absolute frame of reference. In one embodiment, primary mirror 132 and secondary mirror 134 are fabricated by sputtering or otherwise depositing a reflective mirror material (e.g., silver (Ag) or aluminum (Al)) directly onto convex surface 112 and concave surface 117, thereby minimizing manufacturing costs and providing superior optical characteristics. By sputtering or otherwise forming a mirror film on convex surface 112 and concave surface 117 using a known mirror fabrication technique, primary mirror 132 substantially takes the shape of convex surface 112, and secondary mirror 134 substantially takes the shape of concave surface 117. AS such, optical element 110 is molded or otherwise fabricated such that convex surface 112 and concave surface 117 are arranged and shaped to produce the desired mirror shapes. Note that, by forming convex surface 112 and concave surface 117 with the desired mirror shape and position, primary mirror 132 and secondary mirror 134 are effectively self-forming and self-aligning, thus eliminating expensive assembly and alignment costs associated with conventional concentrating solar collectors. Further, because primary mirror 132 and secondary mirror 134 remain affixed to optical element 110, their relative position is permanently set, thereby eliminating the need for adjustment or realignment that may be needed in conventional multiple-part arrangements. In one embodiment, primary mirror 132 and secondary mirror 134 are formed simultaneously using the same (identical) material or materials (e.g., plated Ag), thereby minimizing fabrication costs. Further, by utilizing the surfaces of optical element 110 to fabricate the mirrors, once light enters into optical element 110 through aperture surface 115, the light is only reflected by primary mirror 132/convex surface 112 and secondary mirror 134/concave surface 117 before reaching PV cell 120. As such, the light is subjected to only one air/glass interface (i.e., aperture surface 115), thereby minimizing losses that are otherwise experienced by conventional multi-part concentrating solar collectors. The single air/glass interface loss can be further lowered using an antireflection coating on aperture surface 115. Although it is also possible to separately form primary mirror 132 and secondary mirror 134 and then attach the mirrors to convex surface 112 and concave surface 117, respectively, this production method would greatly increase manufacturing costs and may reduce the superior optical characteristics provided by forming mirror films directly onto convex surface 112 and concave surface 117. Note that a central opening 131 is defined in primary mirror 132 to facilitate the passage of light through cavity 113 to PV cell 120.

Backsheet 140 is fixedly mounted over convex surface 112 and central cavity 113 of optical element 110, and in the present embodiment includes a printed circuit structure 150 that is attached to a backside surface of primary mirror 134 by way of a first adhesive layer 155.

As indicated in FIG. 2, central portion 151 of printed circuit structure 150 is disposed over cavity 113, and curved peripheral portion 152 is secured to the back (non-reflecting) surface of primary mirror 132 by way of adhesive layer 155. In one embodiment, adhesive layer includes Ethylene vinyl acetate copolymers (EVA). Printed circuit structure 150 includes one or more non-conductive layers 153, a first conductor 154A, and a second conductor 154B that are disposed on non-conductive layer 153. In one embodiment, non-conductive layer 153 is a flexible plastic sheet (e.g., a polyimide film such as Kapton® produced by DuPont Electronics), and conductors 154A and 154B are one of copper and Fe—Ni alloy. PV cell 120 is mounted on an inside surface of central portion 151 ouch that terminals 124A and 124B are connected by way of associated solder balls to exposed contact portions of conductors 154A and 154B, respectively. In accordance with another embodiment, printed circuit structure 150 is laminated onto optical element 110 using a vacuum lamination procedure by sandwiching adhesive layer 155 between optical element 110 and printed circuit structure 150.

Top coversheet 180 is a thin transparent (e.g., glass or plastic) substrate that is secured to aperture surface 115 and the back (non-reflecting) surface of secondary mirror 135 by way of a second adhesive layer 185. Top coversheet 180 serves to protect secondary mirror 134 from the harsh outdoor environment by providing a thin, optically transparent (e.g., glass) layer over aperture surface 115 and secondary mirror 134. Glass cover 180 is secured to optical element 110 during the vacuum lamination step used to secure backsheet 140 by sandwiching a layer of optically transparent material such as EVA between the optical element 110 and glass coversheet. Note that after the vacuum lamination process, both top coversheet 180 and printed circuit structure 150 become a permanent part of the CPV device 100. Coversheet 180 serves several useful purposes. For example, coversheet 180 serves to protect the back surface of secondary mirror 134. Coversheet 180 also provides a completely planar surface that is easily cleaned, thereby minimizing maintenance costs. During assembly, coversheet 180 serves as a very flat reference plane to which multiple arrays of concentrators can all be laminated in co-planar registration. Coverplate 180 may have an antireflective coating, which is processed economically in a very large format coating machine. The coated glass may also include means for rejecting unwanted infrared radiation that does not get converted to electricity by the PV cell. Finally, coversheet 180 may be made of tempered glass to provide impact resistance.

FIG. 2 is a side view showing CPV device 100 during operation. Similar to conventional concentrating solar collectors, a collector positioning system (not shown; for example, the tracking system used in the MegaModule™ system produced by Amonix, Incorporated of Torrance, Calif., USA) is utilized to position CPV device 100 such that light beams LB (e.g., solar rays) are directed into aperture surface 115 in a desired direction (e.g., perpendicular to aperture surface 115. PV cell 120 is disposed substantially in a concentrating (focal) region F, which designates the region at which light beams LB are concentrated by primary mirror 132, secondary mirror 134 and any intervening optical structures (e.g., a dielectric flux concentrator). To facilitate the positioning of concentrating region F in central region 113, convex surface 112, primary mirror 132, concave surface 117, and secondary mirror 134 are centered on and substantially symmetrical about an optical axis X that extends substantially perpendicular to aperture surface 115 (i.e., the curved portions of convex surface 112 and concave surface 117 are defined by an arc rotated around optical axis X).

FIG. 3 is a top-side exploded perspective view showing a CPV device 200 according to another embodiment of the present invention. Similar to CPV device 100, CPV device 200 is a laminated structure including an optical element 210, a photovoltaic cell 220, a primary mirror 232 formed on a convex surface 212 of optical element 210, a secondary mirror 234 formed on a concave surface 217 of optical element, a backsheet 240 including a printed circuit structure 250 and a protective shell layer 270 that are laminated over convex surface 212 of optical element 210, a heat slug 260, and a transparent coversheet 280 that is laminated onto an aperture surface 215 of optical element 210.

As indicated in FIG. 3, optical element 210 includes six contiguous facets 219 located around a peripheral edge of aperture surface 215. This six-sided arrangement facilitates the formation of large arrays of CPV devices 200 in a highly space-efficient manner, as discussed in additional detail below and in co-owned and co-pending U.S. patent application Ser. No. 11/110,611 (cited above). In other embodiments, less space-efficient CPV device arrays may be produced using concentrators having other peripheral shapes (e.g., the circular peripheral shape of concentrator 100, described above). A central region (cavity) 213 is defined in (e.g., molded into) convex surface 212 for receiving PV cell 220. The walls of cavity 213 are tapered to accommodate the molding process and to enable components inserted therein to accommodate volume changes due to thermal expansion by gliding out along the tapers.

In accordance with another aspect of the present invention, PV cell 220 is mounted onto a metal substrate 261 of heat slug 260, which is then mounted into cavity 213 of optical element 210. Given that optical element 210 is preferably made of glass, and heat slug 260 is preferably made of metal, it is expected that the two objects will have different coefficients of thermal expansion. Therefore, it is desirable for PV cell 220 and heat slug 260 form an assembly that self-centers itself into cavity 213. Accordingly, heat slug 260 includes a several resilient fingers 263 that have a fixed and integrally formed with or otherwise fixedly connected to metal substrate 261, and a curved body extending between its fixed and free ends. Resilient fingers 263 are shaped to facilitate self-alignment of the heat slug in cavity 213, thereby self-aligning PV cell 220 with the focal point F of the optical system formed by primary mirror 232 and secondary mirror 234 on optical element 210.

Protective shell layer 270 and transparent coversheet 280 provide lamination layers that help seal and protect the concentrator elements (i.e., optical element 210, PV cell 120 and the wiring provided by printed circuit structure 250). Protective plastic shell layer 270 (e.g., Tedlar® produced by DuPont with 150 micron thickness) is secured onto the exposed surface of printed circuit structure 250 using an outer (e.g., EVA) adhesive layer 275. Because Kapton is an inert material, suitable adherence to EVA may require surface preparation. For example, the surface may be prepared using a plasma treatment of the Kapton surface or a silane coupling agent applied to the Kapton prior to assembly. In one embodiment, the flex substrate may have a layer of EVA applied directly after this surface treatment before the components of the stack are assembled together for lamination. Transparent coversheet 280 is formed and attached as discussed above with reference to FIGS. 1 and 2.

Figure 4:
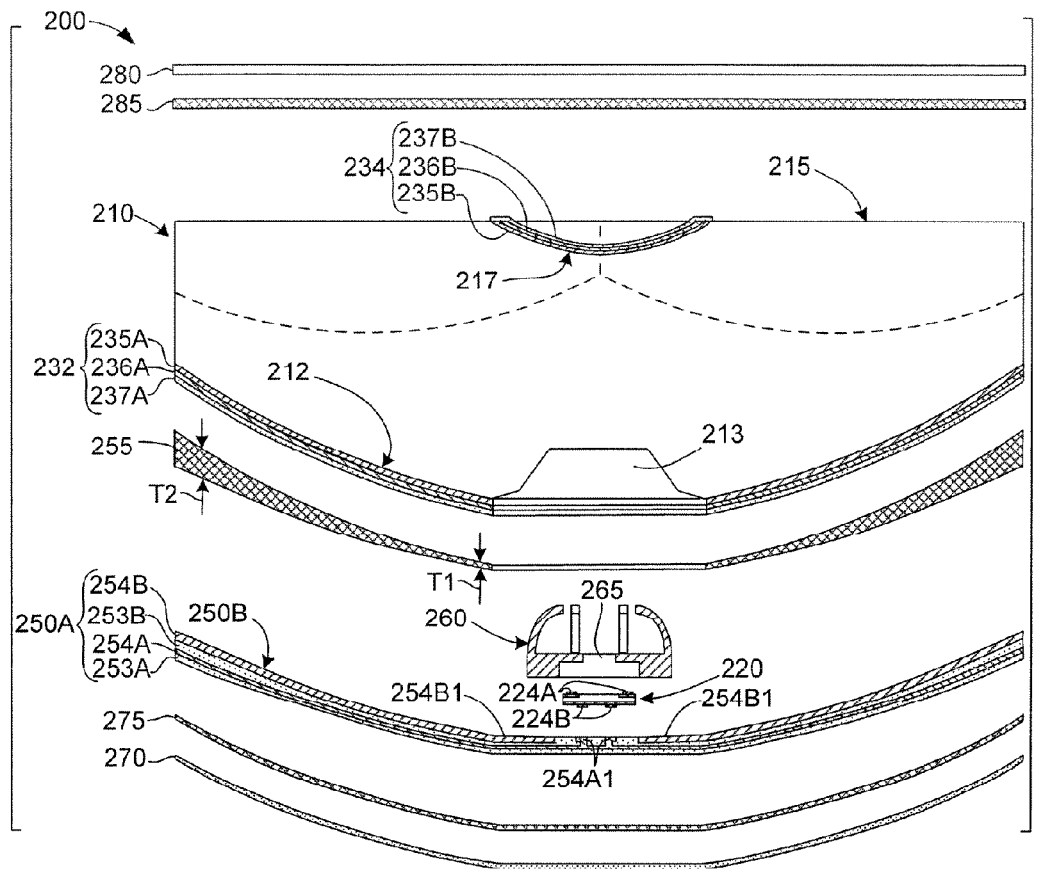
FIG. 4 is an exploded cross-sectional side view showing the CPV device of FIG. 3 in additional detail.
Figure 5:
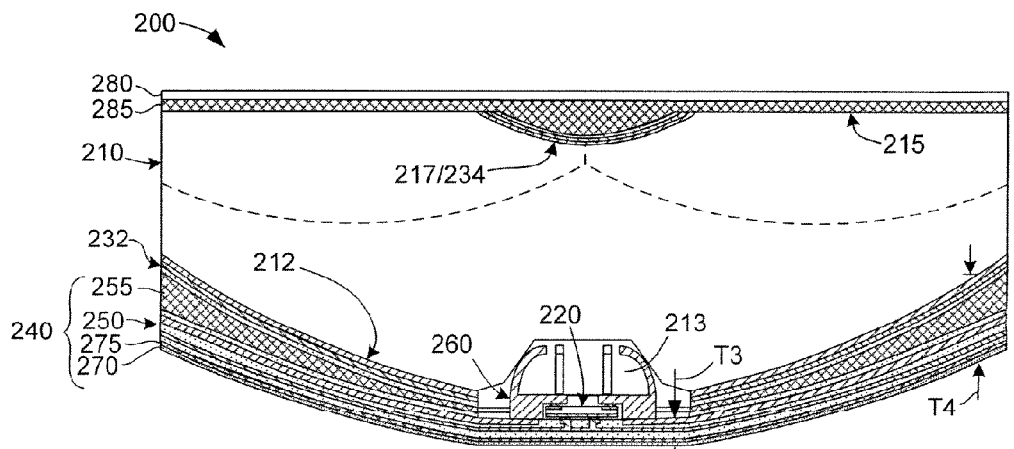
FIG. 5 is an assembled cross-sectional side view showing the CPV device of FIG. 4.

FIGS. 4 and 5 are simplified, partially exploded and assembled cross-sectional side views showing the various components of CPV device 200 in additional detail.

In one embodiment, a fabrication process for producing CPV device 200 begins by forming primary mirror 232 and secondary mirror 234 on optical element 210. First, highly reflective (mirror) material layers 235A and 235B (e.g., silver) are deposited on convex surface 212 and concave surface 217, respectively. The silver can be applied by various techniques including liquid silvering, which is commonly used to produce mirrors on glass for architectural applications. The silver can also be applied by known sputtering techniques such as DC magnetron sputtering. Next, anti-migration layers 236A and 236B (e.g., copper) are deposited over highly reflective material layers 235A and 235B, respectively. In liquid immersion or spray techniques, this process typically uses an electroless Cu process. In a sputter process, metals such as titanium or inconel are used to cap and protect the silver from tarnishing. Next, optional barrier paint layers 237A and 237B are formed over anti-migration layers 235A and 235B, respectively. The barrier paint is typically applied by a spray coating process and then baked to both dry and harden the paint layer.

Next, adhesive layers 255 and 285 (e.g., EVA adhesive produced by Dupont), is deposited onto barrier layers 237A and 237B, respectively, and a transparent adhesive (e.g. silicone, not shown) is deposited into cavity 213. Care should be exercised when applying inner adhesive 255 to ensure none of it enters cavity 213. In an alternative embodiment, adhesive layers 255 and 285 are adhered to printed circuit structure 250 and top coversheet 280, respectively, instead of optical element 210.

In one embodiment, which is depicted in FIG. 5, PV cell 220 is mounted onto the backside (lower) surface of heat slug 260, which defines a circular opening 265 that is positioned over an active area of PV cell 220, and a printed circuit structure 250 is mounted in the manner described above over the open end of cavity 213, thereby enclosing PV cell 220 and heat slug 260 therein. The emitter (topside) contacts of PV cell 220 (e.g., 224A) are electrically connected to metal substrate 261 by way of solder bumps, which provides a conductive path between the emitter terminal of PV cell 220 and first external conductor 254B1 disposed in central portion 251 of printed circuit structure 250. Base (bottom side) contact structure 224B of PV cell 220 are also electrically connected to second conductor 254A1 by way of solder bumps. The structure and arrangement of PV cell 220 and heat slug 260 are described in additional detail in co-owned and co-pending U.S. patent application Ser. No. 11/382,004, cited above.

In one embodiment layer 250B consists of a separate piece of formed sheet metal (eg. Copper or Ni—Fe alloy). Optionally, the heat slug 260 is incorporated into the formed metal part 250B. Contact portions 224A of cell 220 are electrically connected, for example by solder bumps, to the heat slug 260. The contacts 224B on the other side of the cell are contacted by a piece of flex 254A.

As indicated in FIG. 5, in accordance with an aspect of the present invention, a thickness of various laminated layers making up backsheet 240 on the backside of the concentrator is not uniform. Specifically, it is desired that the heat conduction path out the back of CPV device 200 is as short a distance as possible. Ideally, the thickness T3 of the portion of backsheet 240 covering the hottest portion of CPV device 200 (i.e., cavity 213, which is located at the apex of primary mirror 234) is only as thick as necessary to ensure sufficient electrical insulation of the wiring (i.e., conductors 254A and 254B). It is also desired to increase a thickness T4 of backsheet 240 such that the laminated material fills the thinner peripheral regions (interstices) of optical element 210 surrounding convex surface 212 in order to provide added mechanical strength. This thickness variation of backsheet 240 between the peripheral regions and the apex of convex surface 212 is a natural outcome of material flow during the lamination process. A preferred way to achieve this thickness variation is to have an inner layer of lower melting point material, such as EVA layer 255, and an outer protective layer 270 of relatively high melting point plastic material such as Tedlar. The melting and flowing of EVA layer 255 during the application of vacuum and bladder pressure in the laminator will ensure that it will be thinnest at the apical points of the concentrator array (i.e., as shown in FIG. 4, EVA layer 255 assumes a thickness T1 adjacent to the apex of convex surface 212, and a greater thickness T2 in the interstices defined around the periphery of convex surface 212). The lamination operation therefore serves several purposes simultaneously; it holds the optical, electrical and protective layers together, it strengthens the CPV device module, and it planarizes the CPV device module so that the less stretchable outer Tedlar protective layer 270 can conform to the back surface.

In accordance with another aspect of the present invention, printed circuit structure 250 is formed such that a thickness of upper conductor 254B is approximately 70 microns, and has a greater mass per unit area (and, hence, greater lateral thermal conductivity) than the mass per unit area of lower conductor 254B in order to facilitate the transfer of heat from PV cell 220 to aperture surface 215 for radiation into space. The use of upper conductor 254B for heat transfer purposes is disclosed in co-owned and co-pending U.S. patent application Ser. No. 11/381,999, entitled "PASSIVELY COOLED SOLAR CONCENTRATING PHOTOVOLTAIC DEVICE", which is co-filed with the present application and incorporated herewith by reference in its entirety.

In accordance with another embodiment of the present invention, flexible printed circuit structure 250 includes a layer of laminate adhesive such as EVA (not shown). During lamination EVA behaves like a viscous hot melt glue, so the degree to which it can flow may be too limited for it to reach all of the way around the printed circuit structure 250 and bond the interface between the printed circuit structure 250 and primary mirror 234. Because primary mirror 234 includes a conductive material such as silver, it is a further aspect of this invention that an insulating layer (not shown) may be provided between printed circuit structure 250 and primary mirror 234 to prevent electrical shorting.

Figure 6:
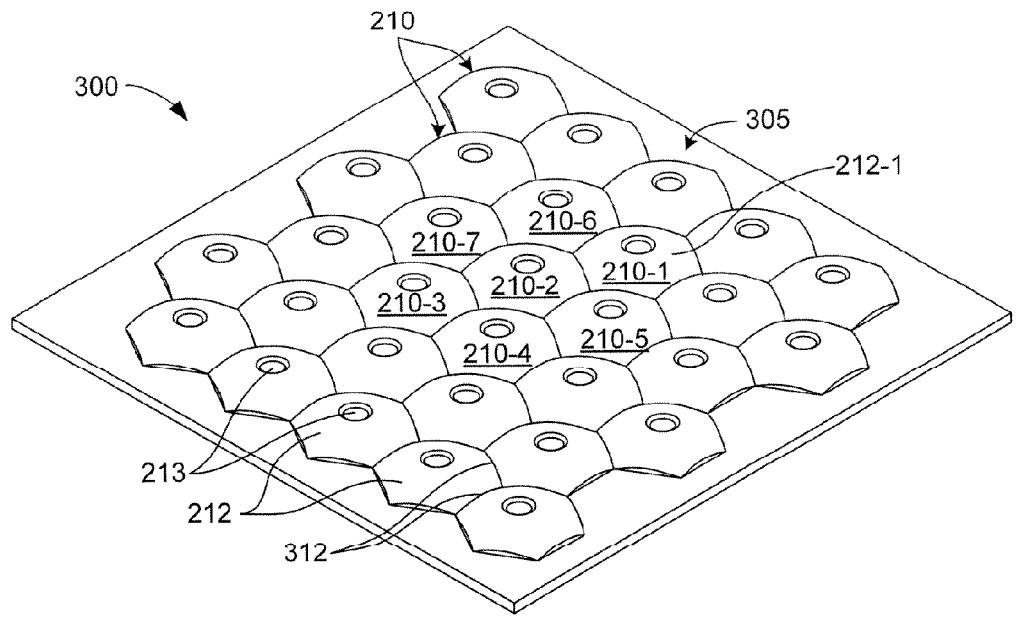
FIG. 6 is a bottom side perspective view showing an optical tile according to another embodiment of the present invention.
Figure 7:
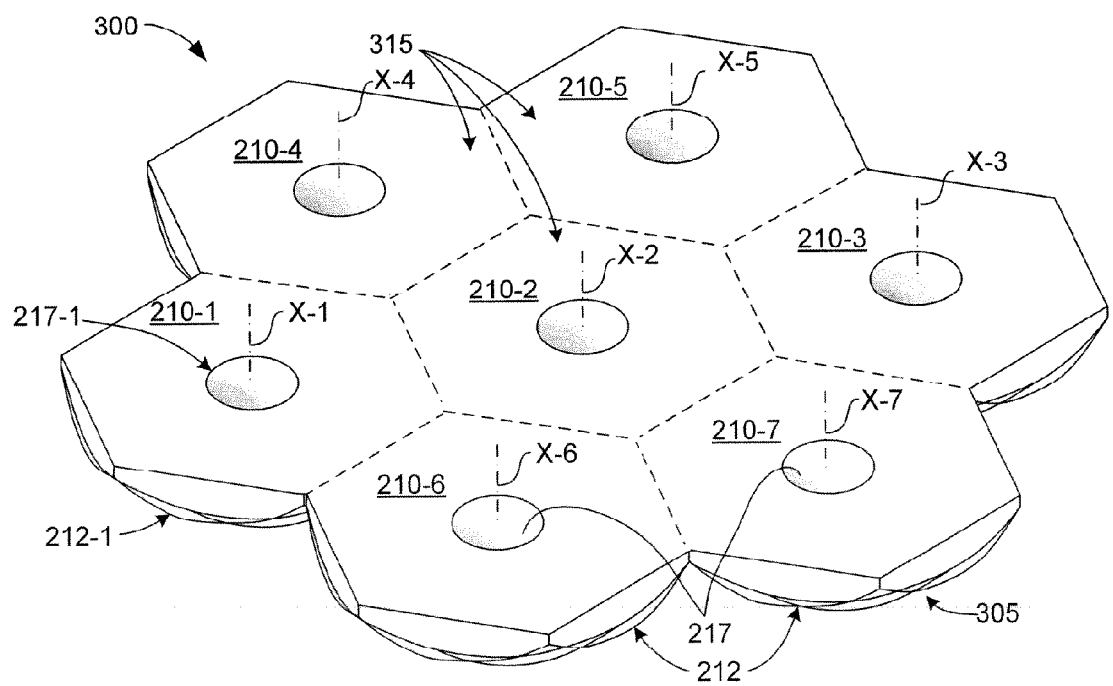
FIG. 7 is a top side perspective view showing a portion of the optical tile of FIG. 6.

FIG. 6 is a bottom side perspective view showing a solid, light-transparent optical tile 310 according to another embodiment of the present invention, and FIG. 7 is a top side perspective view showing a portion of optical tile 310. Optical tile 310 is a solid, light-transparent plate that includes an integrated array of optical elements 210 (e.g., 210-1 to 210-7, which delineated by dashed lines in FIG. 7) arranged in a honeycomb pattern, where each optical element 210 is substantially identical to optical element 210 described above with reference to FIG. 3. As such, optical tile 310 includes a lower surface 305 having multiple convex surfaces (protuberances) 212 that define central cavities 213 and are separated by peripheral troughs (interstices) 312, and a substantially flat aperture (upper) surface 315 including relatively small, spaced-apart depressions (convex surfaces) 217, with each convex surface 212 and associated depression 217 being symmetrical about an associated optical axis X-1 to X-7 that passes through a center of both structures. For example, optical element portion 210-1 includes a convex surface 212-1 and a depression 217-1 that are symmetrical and about and intersected by an optical axis X-1. As indicated in FIG. 7, aperture surface 315 is collectively formed by adjoining aperture surface portions of the adjacent optical elements 210. An advantage provided by optical tile 310 is that it facilitates arraying many small concentrators together in a space efficient manner in order to keep the volume of glass from becoming excessively large, and to keep the amount of power per PV cell manageable without active cooling.

Figure 8:
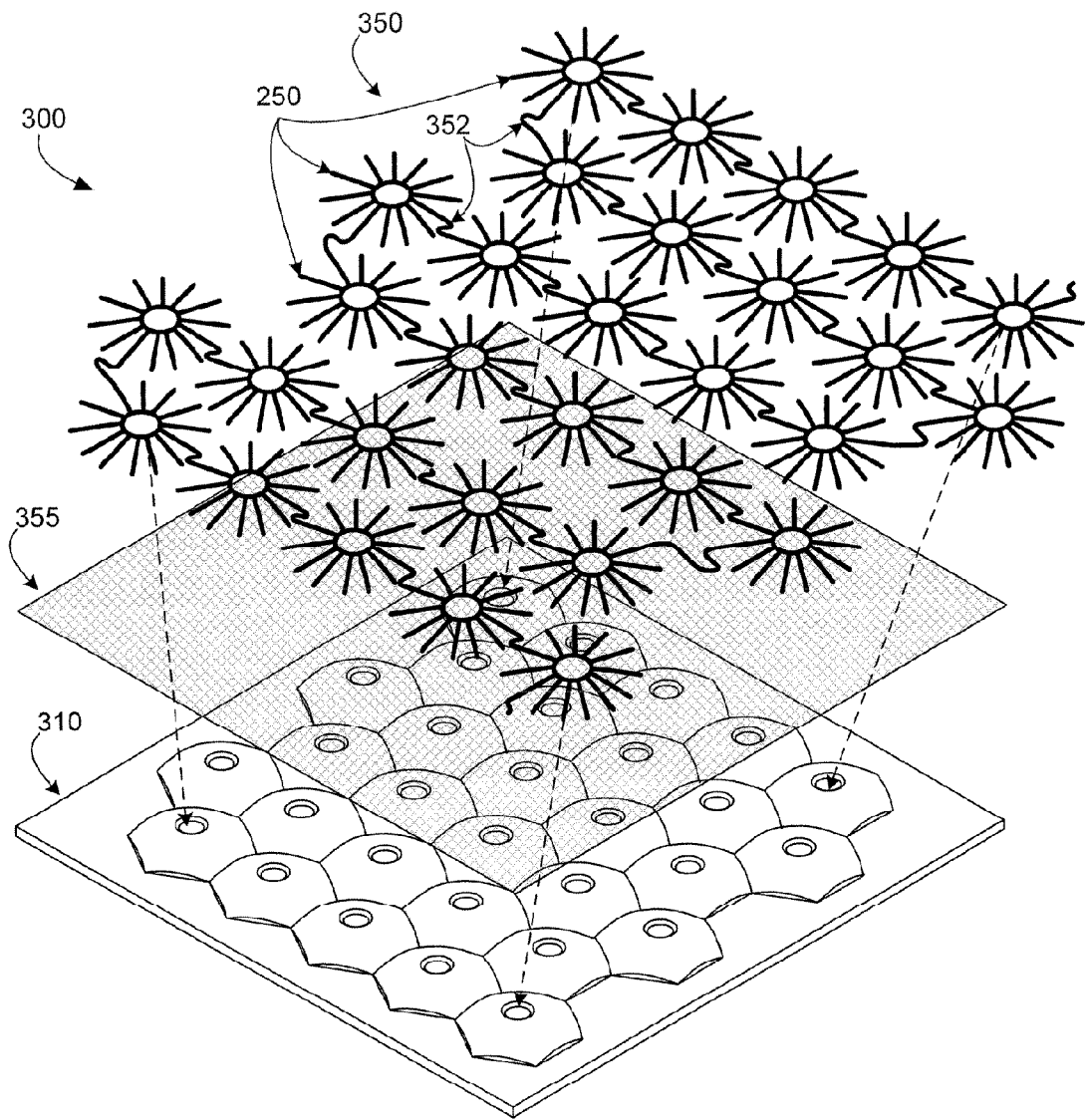
FIG. 8 is an exploded perspective view showing portions of a CPV array according to another embodiment of the present invention.

FIG. 8 is an exploded perspective view showing portions of a CPV array 300 according to another embodiment of the present invention. CPV array 300 includes optical tile 310 (described above) and a printed circuit array 350 that is laminated onto optical tile 310 by way of an adhesive layer 355 in the manner described above. Holes (not shown) may be formed in adhesive layer 355 in order to provide clearance access to the recesses in optical tile 310 by heat slug and cell assemblies on printed circuit array 350. Note that printed circuit array 350 includes a plurality of printed circuit structures 250, each substantially identical to printed circuit structures 250 described above with reference to FIG. 3.

Figure 9:
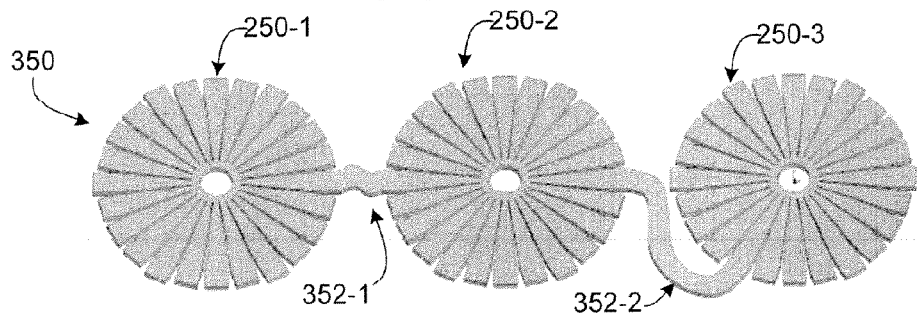
FIG. 9 is a top plan view showing a portion of a flexible printed circuit array utilized in the CPV array of FIG. 8.
Figure 10:
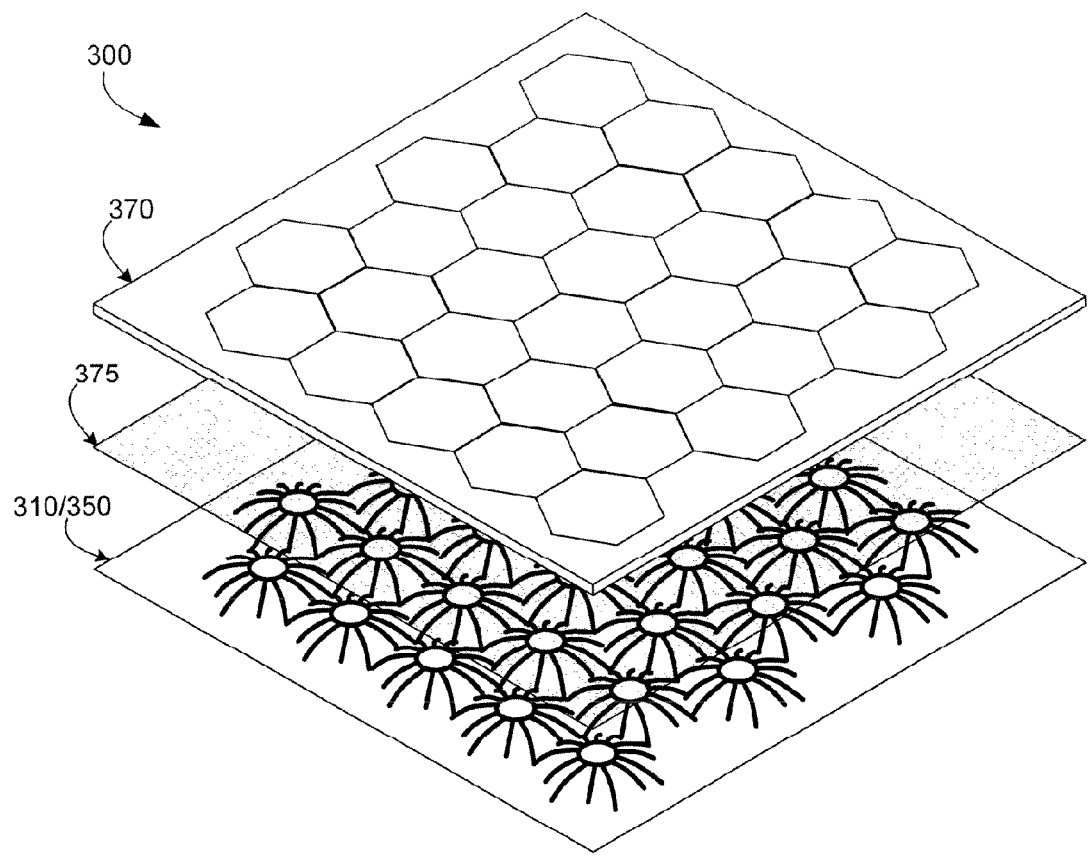
FIG. 10 is an exploded perspective view showing additional portions of the CPV of FIG. 8.
Figure 11:
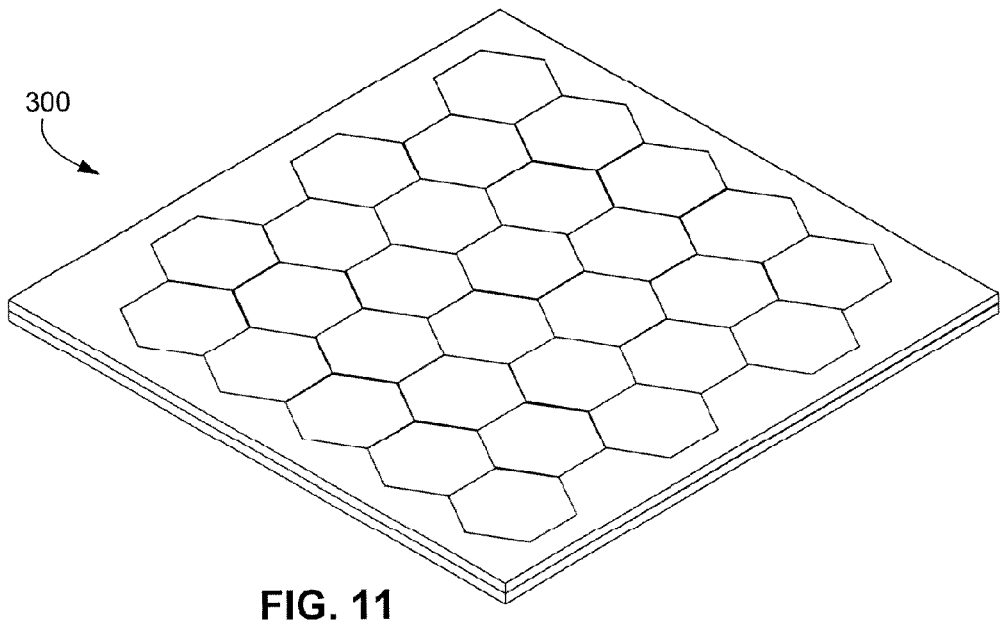
FIG. 11 is a perspective view showing the CPV array of FIG. 10 after lamination.

In accordance with another aspect of the invention, printed circuit array 350 is arranged as a preassembled string PV cells (not shown) mounted on printed circuit structures 250 in the manner described above that is assembled as a single layer into the laminate stack, as depicted in FIG. 8. To form the preassembled string, printed circuit array 350 includes extensible structures 352, which are preferably meandering traces of metal and/or Kapton flex, that connect between adjacent pairs of printed circuit structures 250, and enable printed circuit structures 250 to conform to the contours of optical tile 310 and to span the distance from one cell to the next without large amounts of mechanical stress. FIG. 9 is a perspective view showing a portion of printed circuit array 350 in additional detail. Two extensible connections are illustrated, minimalist meander structure 352-1 extends between printed circuit structures 250-1 and 250-2, and a more extensible meander structure 352-2 extends between printed circuit structures 250-2 and 250-3. The length of meander is determined by the particular contours of the optical tile. It is a further aspect of the present invention that the length of extensible structures 352 is selected to operably extend toward the deepest troughs (interstices) 312 on backside 305 when mounted on optical tile 310 without generating mechanical stress. These extensible structures have the useful property when printed circuit array 350 is produced as a two-dimensional part, such as by a stamping process. That is, extensible structures 352 facilitate contoured registration of the two-dimensional printed circuit array 350 onto the contoured surface of optical array 310 during the lamination process. This implies that prior to lamination, a subassembly, which may include PV cells 220 and heat slugs 260 (both discussed above) mounted on printed circuit structure 250, may be placed on top of and in registration with optical tile 310. As described above and depicted in FIG. 10, radial portions of the printed circuit structures 250 conform to follow the contour of the primary mirror surface during the lamination process. This is desirable for the thermal conduction of heat out the front of the concentrator. To assist this shape conformation, the flex may be pre-shaped or slit in the manner shown in FIG. 9. As indicated in FIG. 10, after printed circuit array 350 is mounted onto optical array 310, Tedlar protective layer 370 is mounted by way of a second EVA layer 375, and then pressure is applied by the air bladder in the vacuum laminator (not shown) to assist the shape conformation. The laminated CPV array 300 is shown in FIG. 11.

Figure 12:
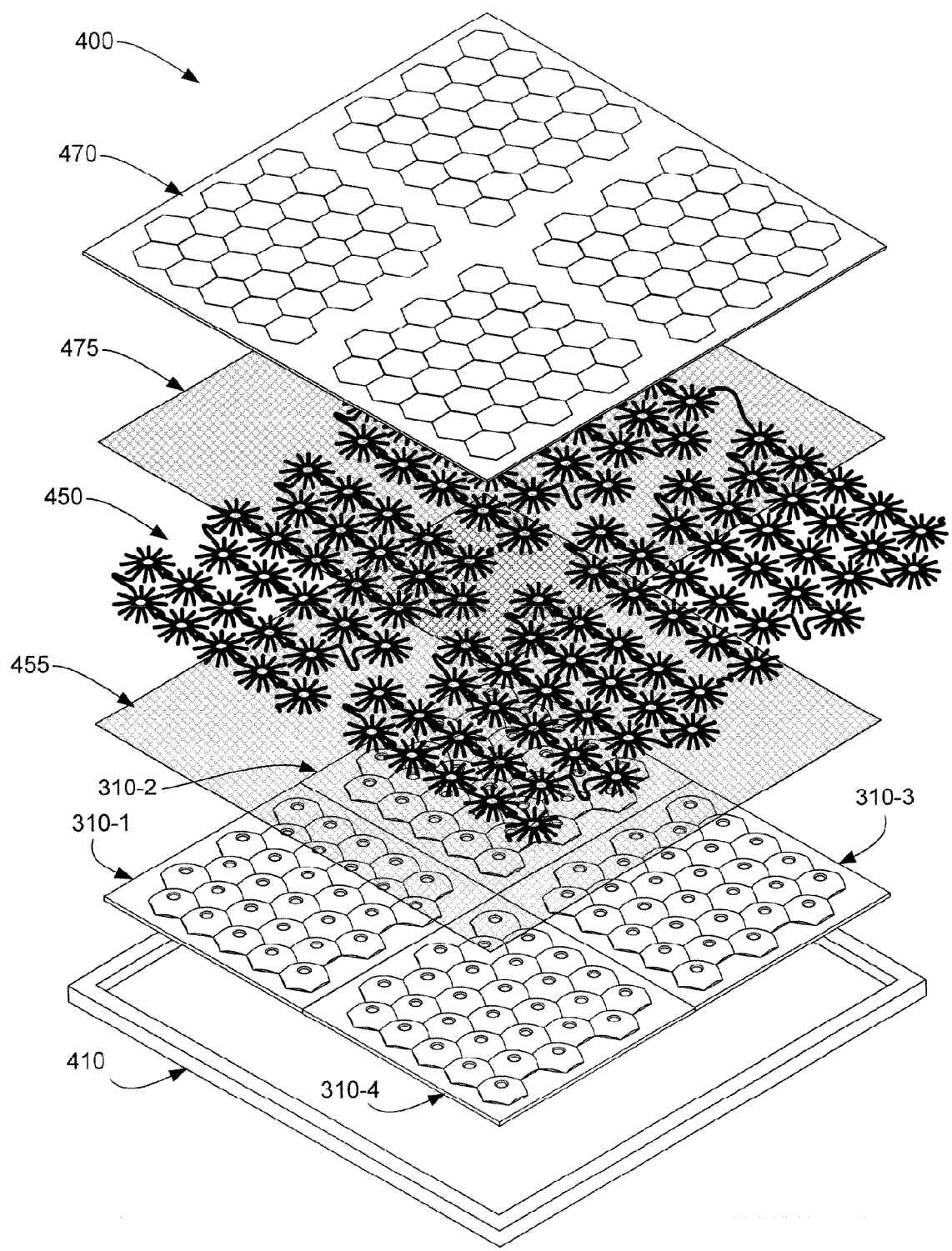
FIG. 12 is an exploded perspective view showing portions of a CPV assembly according to another embodiment of the present invention.
Figure 13:
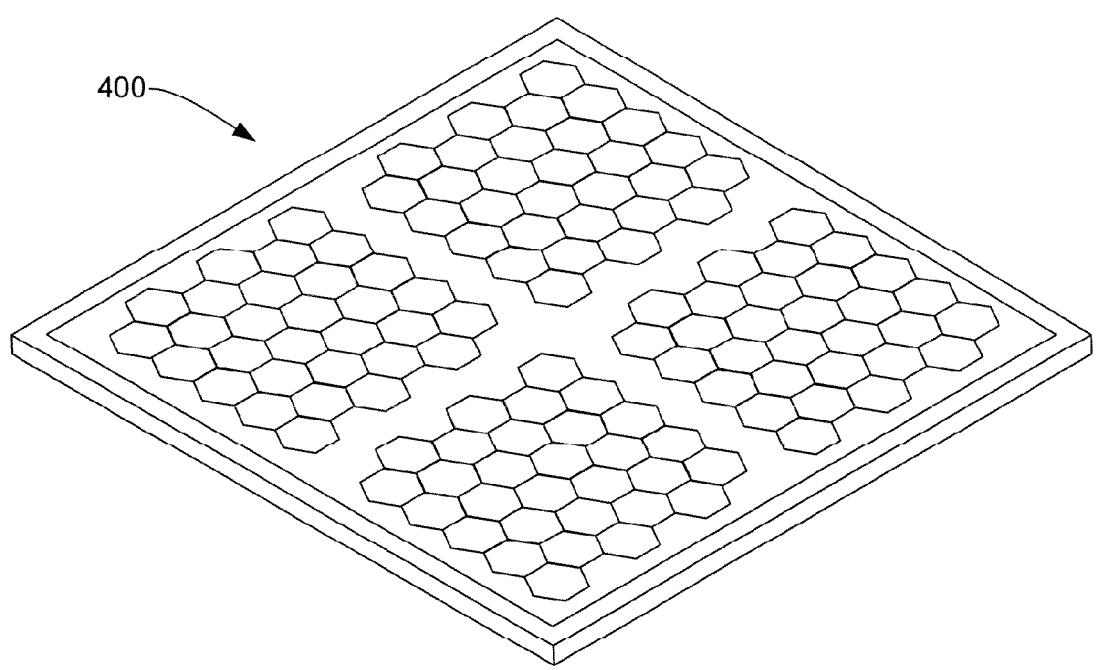
FIG. 13 is a perspective view showing the CPV assembly of FIG. 10 after lamination.

FIGS. 12 and 13 illustrate another embodiment of the invention, wherein multiple optical tiles 310-1 to 310-4 and associated backsheet layers are laminated together to form common CPV assembly 400. It is expected that the size of the largest optical concentrator arrays that can be formed in a typical glass or plastic molding apparatus (currently on the order of 1 square foot) will be considerably smaller than the largest module area that can be accommodated in a laminator (currently several square meters). It is also an aspect of this invention that a frame structure 410 is used to hold multiple optical tiles 310-1 to 310-4 to form laminated assembly 400. Frame structure 410 may take a form similar to a windshield frame. Tiles 310-1 to 310-4 may be glued into frame 410 with an adhesive. A single-piece, flexible printed circuit array 450 is then mounted over the arranged tiles by way of a first adhesive layer 455 using methods similar to those described above, and then a single-piece protective layer 470 is mounted over all four tiles using a second adhesive layer 475. The stack is then subjected to lamination, producing CPV assembly 400, which is shown in FIG. 13.

Although the present invention has been described with respect to certain specific embodiments, it will be clear to those skilled in the art that the inventive features of the present invention are applicable to other embodiments as well, all of which are intended to fall within the scope of the present invention. For example, the primary and secondary mirrors may be preformed and then mounted to the optical element using a suitable adhesive, but this approach may substantially increase production costs. In yet another alternative embodiment, the curved surface utilized to form the secondary mirror may be convex instead of concave, thus being in the form of a classical Gregorian type system. In yet another alternative embodiment, the curved surfaces utilized to form the primary and secondary mirrors may be elliptical, ellipsoidal, spherical, or other curved shape.

The invention claimed is:

1. A concentrating photovoltaic device comprising:
a solid, light-transparent optical element having a first side including a convex surface, a second side including a substantially flat aperture surface and a depression in a central portion of the flat aperture surface, wherein the depression is smaller than the convex surface;
a primary mirror disposed on the convex surface such that the primary mirror substantially takes a shape of the convex surface, and a secondary mirror disposed on the depression such that the secondary mirror substantially takes a shape of the depression, the primary and secondary mirrors defining a focal point at which light received by the optical element is concentrated, the primary mirror being formed such that the primary mirror takes a shape of the convex surface;
a photovoltaic cell disposed at the focal point; and
a backsheet fixedly mounted over the convex surface of the optical element, the backsheet including a flexible printed circuit structure and a first adhesive layer disposed between the flexible printed circuit structure and the convex surface,
wherein the flexible printed circuit structure includes one or more non-conductive layers and first and second conductors disposed on the non-conductive layers,
wherein portions of the flexible printed circuit structure conform to follow a contour of the primary mirror, and
wherein the photovoltaic cell includes first and second terminals respectively electrically connected to the first and second conductors of the flexible printed circuit structure.

2. The concentrating photovoltaic device according to claim 1, wherein the flexible printed circuit structure includes a central portion disposed over a center of the convex surface of the optical element and one or more peripheral portions extending from the central portion over the convex surface.

3. The concentrating photovoltaic device according to claim 2, wherein a first thickness of the first adhesive layer adjacent to the center of the convex surface is less than a second thickness adjacent to a peripheral edge of the convex surface.

4. The concentrating photovoltaic device according to claim 2, wherein a first thickness of the backsheet adjacent to the center of the convex surface is less than a second thickness adjacent to a peripheral edge of the convex surface.

5. The concentrating photovoltaic device according to claim 2, further comprising an optically transparent material disposed on the center of the convex surface between the central portion of the flexible printed circuit structure and an adjacent surface of the optical element.

6. The concentrating photovoltaic device according to claim 5, wherein the optically transparent material defines a cavity located at the center of the convex surface, and wherein the concentrating photovoltaic device further comprising a heat slug disposed in the cavity and electrically connected between at least one of the first and second terminals of the PV device and at least one of the first and second conductors of the flexible printed circuit structure.

7. The concentrating photovoltaic device according to claim 2, wherein the one or more peripheral portions of the flexible printed circuit structure comprise a plurality of radial arms extending from the central portion, wherein each adjacent pair of radial arms are separated by an associated slit.

8. The concentrating photovoltaic device according to claim 1,
wherein the one or more non-conductive layers of the flexible printed circuit structure comprise a flexible polyimide film, and
wherein the first and second conductors of the flexible printed circuit structure comprise one of copper or Fe—Ni alloy disposed on the flexible polyimide film.

9. The concentrating photovoltaic device according to claim 8,
wherein the second conductor is disposed between the first conductor and the optical element, and
wherein a mass per unit area of the second conductor is greater than a mass per unit area of the first conductor.

10. The concentrating photovoltaic device according to claim 1, wherein the first adhesive layer comprises ethylene vinyl acetate copolymers.

11. The concentrating photovoltaic device according to claim 1, wherein the backsheet further comprises a protective shell layer disposed on a backside surface of the flexible printed circuit structure, and a second adhesive layer disposed between the backside surface of the flexible printed circuit structure and the protective shell layer.

12. The concentrating photovoltaic device according to claim 11, wherein the protective shell layer comprises a relatively high melting point plastic material with respect to a melting point of the second adhesive layer, and the second adhesive layer comprises ethylene vinyl acetate copolymers.

13. The concentrating photovoltaic device according to claim 1, further comprising a transparent coversheet disposed over the aperture surface and the secondary mirror, and a third adhesive layer disposed between the transparent coversheet and the aperture surface.

14. The concentrating photovoltaic device according to claim 13, wherein transparent coversheet comprises tempered glass and the third adhesive layer comprises ethylene vinyl acetate copolymers.

15. The concentrating photovoltaic device according to claim 14, wherein transparent coversheet comprises one of an antireflective coating and an element for rejecting radiation having one or more predetermined wavelengths.

16. A laminated concentrating solar collector array comprising:
a solid, light-transparent optical tile having opposing first and second surfaces, wherein the first surface includes a plurality of convex portions, the second surface includes a plurality of substantially flat aperture portions and a plurality of depressions, the depressions being smaller than the convex portions;
a plurality of optical elements formed on the optical tile, each optical element including a primary mirror disposed on an associated one of the plurality of convex portions and a secondary mirror disposed on an associated one of the plurality of depressions, each optical element defining a focal region at which light received by the optical element is concentrated by the primary and secondary mirrors of said each optical element;
a plurality of photovoltaic cells, each photovoltaic cell being disposed at the focal point of an associated optical element; and
a backsheet fixedly mounted over the first surface of the optical tile, the backsheet including a flexible printed circuit array and a first adhesive layer disposed between the printed circuit array and the first surface,
wherein the flexible printed circuit array includes one or more non-conductive layers and first and second conductors disposed on the non-conductive layers,
wherein portions of the flexible printed circuit array conform to follow a contour of each primary mirror of the plurality of optical elements, and
wherein each PV cell includes first and second terminals respectively electrically connected to the first and second conductors of the flexible printed circuit array.

17. The laminated concentrating solar collector array according to claim 16, wherein the flexible printed circuit array comprises:
a plurality of printed circuit structures, each printed circuit structure including a central portion having an associated photovoltaic cell mounted thereon; and
a plurality of extensible structures connected between adjacent pairs of said printed circuit structures.

18. A method for producing a concentrating photovoltaic device comprising:
forming a solid, light-transparent optical element having opposing first and second surfaces, wherein the first surface includes a convex surface, the second surface includes a substantially flat aperture surface and a curved surface and the curved surface is smaller than the convex surface;
disposing a primary mirror on the convex surface and a secondary mirror on the curved surface such that the primary mirror and secondary mirror define a focal point at which light received by the optical element is concentrated;
forming a flexible printed circuit structure including one or more non-conductive layers and first and second conductors disposed on the non-conductive layers;
mounting a photovoltaic cell onto the flexible printed circuit structure such that a terminal of the PV cell is electrically connected to at least one of the first or second conductors of the flexible printed circuit structure; and
laminating the flexible printed circuit structure onto the optical element such that portions of the flexible printed circuit structure conform to follow a contour of the primary mirror, and the photovoltaic cell is disposed at the focal point.

* * * * *